United States Patent
Loeppert et al.

(10) Patent No.: US 9,399,574 B2
(45) Date of Patent: Jul. 26, 2016

(54) MEMS PACKAGE AND A METHOD FOR MANUFACTURING THE SAME

(71) Applicant: Knowles Electronic LLC, Itasca, IL (US)

(72) Inventors: Peter V. Loeppert, Durand, IL (US); Denise P. Czech, Schaumburg, IL (US); Lawrence A. Grunert, Lombard, IL (US); Kurt B. Friel, Sycamore, IL (US); Qing Wang, Hanover Park, IL (US)

(73) Assignee: Knowles Electronics LLC, Itasca, IL (US)

( * ) Notice: Subject to any disclaimer, the term of this patent is extended or adjusted under 35 U.S.C. 154(b) by 0 days.

(21) Appl. No.: 14/632,428

(22) Filed: Feb. 26, 2015

(65) Prior Publication Data

US 2015/0166335 A1 Jun. 18, 2015

Related U.S. Application Data

(63) Continuation-in-part of application No. 12/856,101, filed on Aug. 13, 2010, now Pat. No. 8,987,030.

(60) Provisional application No. 61/233,589, filed on Aug. 13, 2009.

(51) Int. Cl.
*B81C 1/00* (2006.01)
*B81B 7/00* (2006.01)
(Continued)

(52) U.S. Cl.
CPC ........... *B81C 1/00888* (2013.01); *B81B 7/0061* (2013.01); *B81B 7/0064* (2013.01); *H01L 21/56* (2013.01); *H01L 24/97* (2013.01); *B81B 2201/0257* (2013.01); *B81C 2203/0109* (2013.01); *B81C 2203/019* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48137* (2013.01); *H01L 2224/48227* (2013.01); *H01L 2224/73265* (2013.01); *H01L 2224/97* (2013.01); *H01L 2924/12042* (2013.01);
(Continued)

(58) Field of Classification Search
CPC .................. B81C 1/00888; B81C 2203/0109; B81C 2203/019; B81B 7/0061; B81B 7/0064; B81B 2201/0257; H01L 21/56; H01L 24/97; H01L 24/16; H01L 24/32; H01L 24/48; H01L 24/73; H01L 2224/16225; H01L 2224/32
See application file for complete search history.

(56) References Cited

U.S. PATENT DOCUMENTS

| | | | |
|---|---|---|---|
| 6,117,705 | A | 9/2000 | Glenn et al. |
| 6,403,881 | B1 | 6/2002 | Hughes |

(Continued)

OTHER PUBLICATIONS

Gilleo, Ken, "MEMS/MOEMS Packaging", McGraw-Hill, 14 pages (2005).

(Continued)

*Primary Examiner* — Julio J Maldonado
*Assistant Examiner* — Farun Lu
(74) *Attorney, Agent, or Firm* — Lathrop & Gage LLP

(57) ABSTRACT

A plurality of MEMS transducer packages is manufactured by placement of a plurality of transducers onto a panel of undivided package substrates, attachment of a plurality of individual covers onto a panel and over the transducers, depositing an epoxy into the channels between the covers, and then singulating the panel into individual MEMS transducer packages.

16 Claims, 11 Drawing Sheets

(51) Int. Cl.
*H01L 21/56* (2006.01)
*H01L 23/00* (2006.01)

(52) U.S. Cl.
CPC ............... *H01L 2924/1433* (2013.01); *H01L 2924/1461* (2013.01); *H01L 2924/15151* (2013.01); *H01L 2924/15192* (2013.01); *H01L 2924/3025* (2013.01)

(56) References Cited

U.S. PATENT DOCUMENTS

| | | | |
|---|---|---|---|
| 6,526,653 | B1 | 3/2003 | Glenn et al. |
| 6,594,369 | B1 | 7/2003 | Une |
| 6,707,168 | B1 | 3/2004 | Hoffman et al. |
| 6,914,367 | B2 | 7/2005 | Furukawa |
| 6,928,718 | B2 | 8/2005 | Carpenter |
| 7,381,589 | B2 | 6/2008 | Minervini |
| 7,388,281 | B2 | 6/2008 | Krueger et al. |
| 7,825,509 | B1 * | 11/2010 | Baumhauer, Jr. ..... B81C 1/0023 257/723 |
| 2001/0048156 | A1 | 12/2001 | Fukuizumi |
| 2002/0053724 | A1 | 5/2002 | Lai et al. |
| 2003/0109077 | A1 | 6/2003 | Kim et al. |
| 2007/0013036 | A1 | 1/2007 | Zhe et al. |
| 2007/0057602 | A1 | 3/2007 | Song |
| 2009/0001553 | A1 | 1/2009 | Pahl et al. |
| 2009/0146268 | A1 | 6/2009 | Huang et al. |
| 2009/0257614 | A1 | 10/2009 | Mei et al. |
| 2009/0298235 | A1 | 12/2009 | Kostiew et al. |
| 2010/0033268 | A1 | 2/2010 | Iizuka et al. |
| 2011/0115059 | A1 | 5/2011 | Lee et al. |

OTHER PUBLICATIONS

Lau, et al., "Advanced MEMS Packaging", McGraw-Hill, 4 pages (2010).

Hu, Tai-Ran, MEMS Packaging:, INSPEC, 6 pages (Tai-Ran Hsu, ed. 2004).

Maluf, Nadim, "An Introduction to Microelectromechanical System Engineering", Artech House, pp. 201-202 (2000).

* cited by examiner

MEMS PACKAGE AND A METHOD FOR MANUFACTURING THE SAME

RELATED APPLICATIONS

This application is a continuation-in-part to U.S. application Ser. No. 12/856,101, filed Aug. 13, 2010, which claims priority to U.S. Application Ser. No. 61/233,589, filed Aug. 13, 2009. These applications are hereby incorporated by reference herein in their entireties for all purposes.

BACKGROUND OF THE INVENTION

Unlike more traditional semiconductor components, a "microelectromechanical systems" ("MEMS") transducer by definition includes a "mechanical" component. By way of example and not limitation, a MEMS transducer of the present invention can be a pressure sensor, microphone, accelerometer, gyroscope, chemical sensor, or other property measurement devices, each of which requires movement: A pressure sensor may have a deformable diaphragm that incorporates piezoresistive material that will undergo electrical conductivity changes as the diaphragm deforms. A microphone may have a fixed backplate and deformable diaphragm that form the plates of a capacitor, with the capacitance changing in response to the amplitude and frequency of the sound waves striking the diaphragm. An accelerometer may have a movable spring-loaded plate in close proximity to a fixed plate, such that when the accelerometer experiences inertial motion—acceleration, deceleration, or rotation—the capacitance between the plates will change. In a chemical sensor, the device itself doesn't move, but instead, may have ports that allow the movement of fluids through the sensor; as the surface of the device absorbs fluids passing through the sensor, the electrical characteristics of the sensor (for example, its conductivity) changes. As such, a package for a MEMS transducer must provide the traditional elements of a semiconductor package—protection from physical damage and electromagnetic interference, first and second-level interconnections, geometric translation, thermal management, and the like—but it must also provide interior space where the mechanical components of the MEMS transducer have freedom to move.

A common MEMS package in the prior art may involve mechanically and electrically coupling the MEMS transducer to a flat substrate and then attaching a cup-shaped lid over the top. For example, U.S. Pat. No. 6,781,231 discloses a MEMS microphone package comprising a MEMS transducer attached to a PCB substrate and covered by a cup-shaped metal cap. Such MEMS packages can be manufactured in quantity by attaching multiple MEMS transducers on a PCB panel, attaching caps over the MEMS transducers, and then dicing the panel into individual MEMS packages, as disclosed, for example, by U.S. Pat. No. 8,018,049.

However, manufacturing MEMS packages according to prior art has certain drawbacks. First, as shown in FIG. 1, a cup-shaped cap may have rounded edges on the top of the package; in some applications, it is preferable to have a MEMS package with sharp 90° edges on all corners, such as the package shown in FIG. 2. Thus there is the need for a package and manufacturing method that utilizes a rounded cap but results in a package with sharp corners.

Second, for many applications, it is sufficient to mount the transducer to the same side of the package as the second-level interconnects. However, in some applications, it is preferable to mount the transducer to the opposite side of the package as the second-level interconnects. For example, a top-port surface mount MEMS microphone may have more-favorable acoustic characteristics when the MEMS microphone die is mounted directly over the port. In the prior art, this could be achieved by putting the port in the substrate, mounting the die over the port, putting the second-level interconnects on the cover, and including electrical pathways in the walls of the cover. However, because the package cavity must be acoustically sealed, a seal must be included between the cover and substrate; in the prior art, as shown in FIGS. 21 and 22, the seal was achieved by using a continuous solder seal ring 402 around the perimeter of the substrate 400 with a corresponding solder ring 403 on the bottom of the cover 401, However, this approach requires more space and is susceptible to shorts between the solder rings and the pads. Thus, there is a need for a package and manufacturing method that seals the cap to the substrate without the need for a solder ring.

Embodiments disclosed and claimed herein address these issues and others that will be clear to one of ordinary skill.

SUMMARY OF THE INVENTION

The present invention relates generally to novel packages for microelectromechanical system ("MEMS") transducers and methods for manufacturing such packages.

In embodiments of the present invention, a plurality of packages for MEMS transducers is built by first placing transducers onto a panel of base substrate material. Next, covers are placed over the transducers, creating channels between the covers. Next, an epoxy or other material is deposited into the channels (but not over the tops of the covers) and allowed to harden. Finally, the panel is singulated along the channels to create the plurality of individual MEMS transducer packages.

In embodiments of the present invention, each cover is substantially cup-shaped; that is, the cover has a top portion and four side portions that are substantially perpendicular to the top portion, with an interior cavity in the space under the top portion and between the side portions. In some embodiments, the intersection between the top portion and each of the vertical side portions is a hard 90° corner; in other embodiments, the intersection between the top portion and each of the vertical side portions is a rounded or angled corner. In some embodiments, the intersection between each of the vertical side portions is a hard 90° corner; in other embodiments, the intersection between adjacent vertical side portions is a rounded or angled corner.

In some embodiments, each cover is a metal "can," as that term would be understood by one of ordinary skill. The covers are attached to the substrate panel, which may be, for example, FR-4 material, using an adhesive or solder. The metal cover may be electrically connected to a ground signal through the base to prevent electromagnetic radiation from interfering with the functionality of the MEMS transducer. In other embodiments, each cover is a composite of conductive and non-conductive material. There are solder pads on the top surface of the cover, which are electrically connected along conductive pathways on the interior, exterior, or within the cover, to solder pads on the bottom surface of the edge of the cover. The solder pads on the bottom surface of the side portions of the cover correspond to solder pads on the top surface of the substrate; during manufacture, the pads are mechanically and electrically connected using a solder reflow process, leaving a slight gap between the top surface of the substrate and the bottom surface of the side portions of each cover. After all of the covers have been attached, the channels between the covers are filled with an epoxy or other material having viscosity such that the epoxy seals the gaps between the covers and substrate but does not enter the interior cavity under the cover.

In some embodiments, the transducer is mechanically mounted and electrically connected to pads on the top surface of the substrate using flip-chip mounting techniques. In other embodiments, the transducer is mechanically mounted to the substrate using an adhesive, and electrically connected to the substrate pads using wire bonding. In other embodiments, the transducer is mechanically mounted indirectly to the substrate using a raised pedestal/platform on the top surface of the substrate. In addition to the transducer, other electrical components may be mechanically mounted and electrically connected to the substrate using comparable methods as used for mounting and connecting the transducer.

In some embodiments, the top surface of the substrate includes first-level interconnections, such as solder pads, for directly or indirectly electrically connecting to the transducer and/or other electrical components that may be present. There may be electrical pathways formed on the top surface of the substrate, within the substrate (where the substrate has multiple layers), and/or on the bottom surface of the substrate. There may be solder pads found on the bottom surface of the substrate and/or top surface of the cover which are suitable for making second-level interconnections to an external printed circuit board using a reflow soldering process. Alternatively, these solder pads may be replaced with other second-level interconnection mechanisms suited for other applications.

BRIEF DESCRIPTION OF THE DRAWINGS

For a more complete understanding of the disclosure, reference should be made to the following detailed description and accompanying drawings wherein.

DETAILED DESCRIPTION OF THE INVENTION

Figure 1:
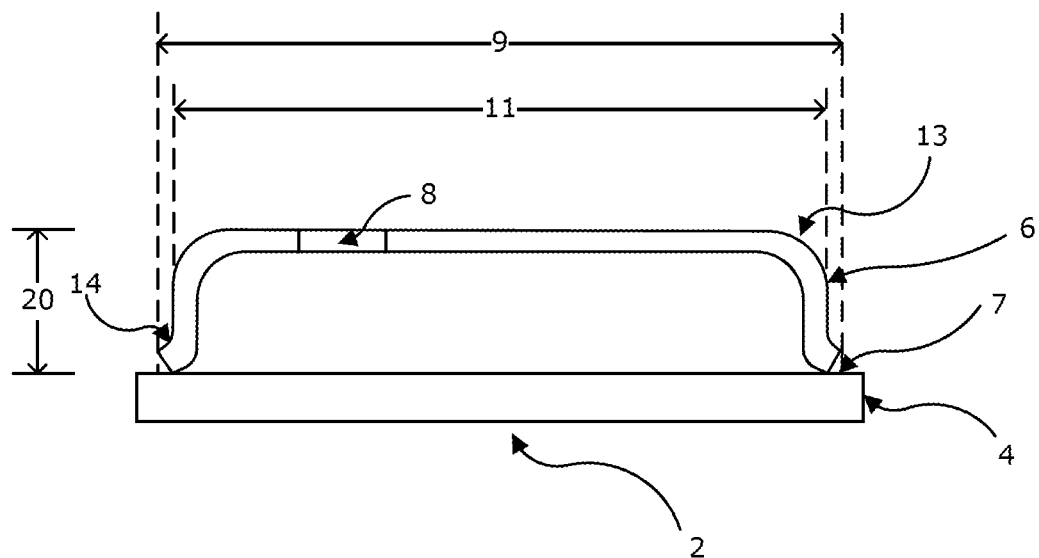
FIG. 1 is a side cross-sectional view of a metal can and base of a package in an embodiment of the present invention.

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

First Embodiment

In a first embodiment of the present invention, a plurality of packages for MEMS transducers is manufactured with an epoxy wall surrounding a metal layer that forms a cover, or "can" as may be understood by one of ordinary skill.

Figure 2:
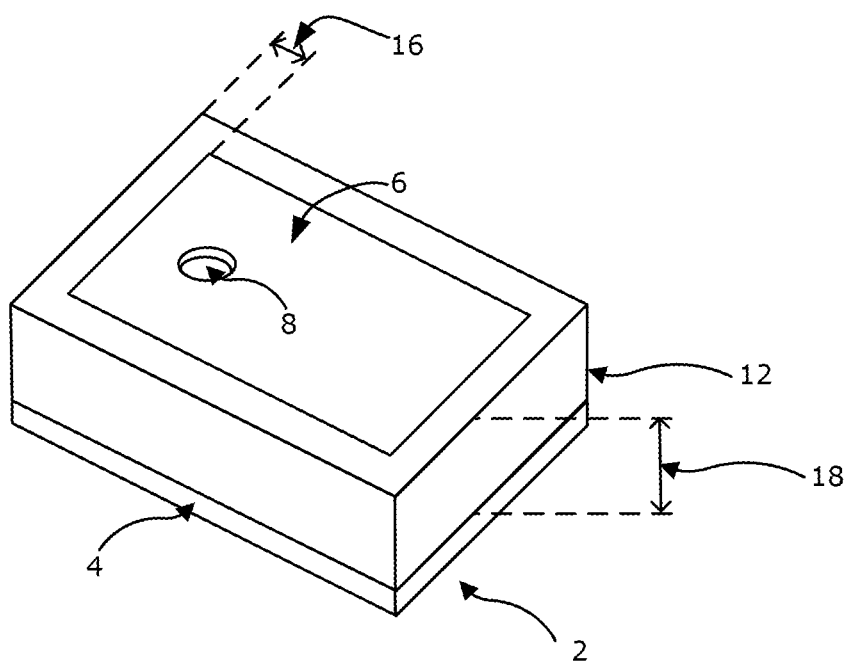
FIG. 2 is a perspective of the package of FIG. 1 including an epoxy wall surrounding the metal can in an embodiment of the present invention.

Referring to FIGS. 1-2, a cover and base layer, or substrate, of a package 2 is illustrated. Base layer 4 may be a printed circuit board panel. An example of material used to construct this layer may be FR-4 material. Other materials, such as plastics, fiberglass-based composites, coated metals, ceramics, flex, and other packaging materials known to one of ordinary skill are also contemplated. Cover 6 (the "can") may be attached to base layer 4. The attachment may be facilitated via adhesives and/or soldering and/or any other methods contemplated by those of skill in the art. The cover 6 may be constructed from aluminum, brass, nickel, metals in general, plastics, ceramics, semiconductors and composites of all mentioned previously. Cover 6 is attached for protection and processibility. Cover 6 optionally contains an aperture 8 which itself may incorporate a barrier to prevent water, particles and/or light from entering the package and damaging the internal components inside, i.e. semiconductor chips (not shown). Aperture 8 is adapted for allowing sound waves to reach a transducer. Cover 6 may have a substantially square, or otherwise rectangular, shape with somewhat rounded corners 14. Cover 6 may attach to the base layer 4 at a lower end 7. A perimeter 9 at the lower end 7 may be greater than a perimeter 11 at an upper end 13 of Cover 6.

An epoxy wall or boundary 12 may surround the cover 6. Examples of epoxies which may be utilized are EPO-TEK H70E series, Ablebond 2035SC, or the like. In an embodiment, the epoxy wall 12 may have a thickness 16 in a range from 0.025 mm to 0.5 mm. In an embodiment, the epoxy wall 12 may have a height 18 which, in relative terms, is less than a height 20 of the metal cover 6. Both the cover 6 and the epoxy wall 12 are positioned on the base layer 4. By surrounding the cover 6, the epoxy wall 12 may provide a gasket-type functionality (i.e., may prevent leakage of gases, materials, etc., into or out of the cover 6). In an embodiment, the compound that is dispensed or otherwise applied is a self-leveling compound, in a fluid, paste or other form. In another embodiment the compound may be leveled during a post processing step such as curing or re-flowing.

Figure 3:
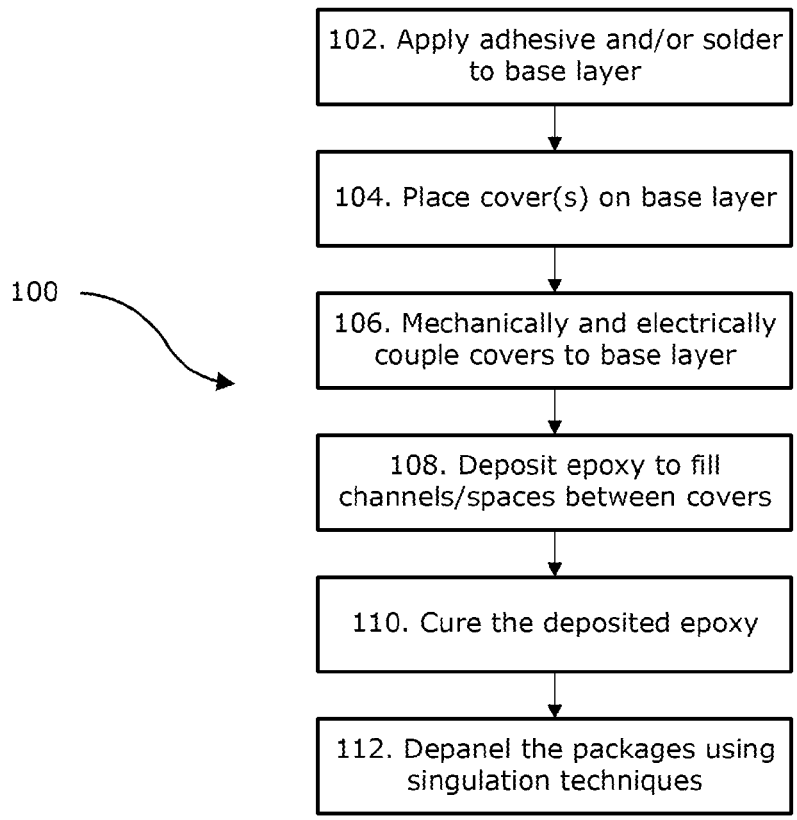
FIG. 3 is a method for manufacturing a package in an embodiment of the present invention.
Figure 4:
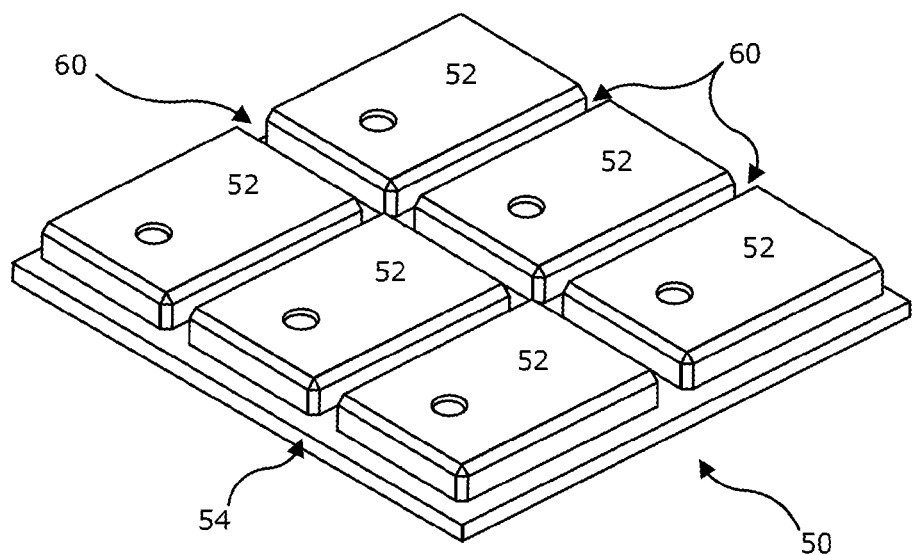
FIG. 4 is a perspective view of an array of microphone packages in an embodiment of the present invention.
Figure 5:
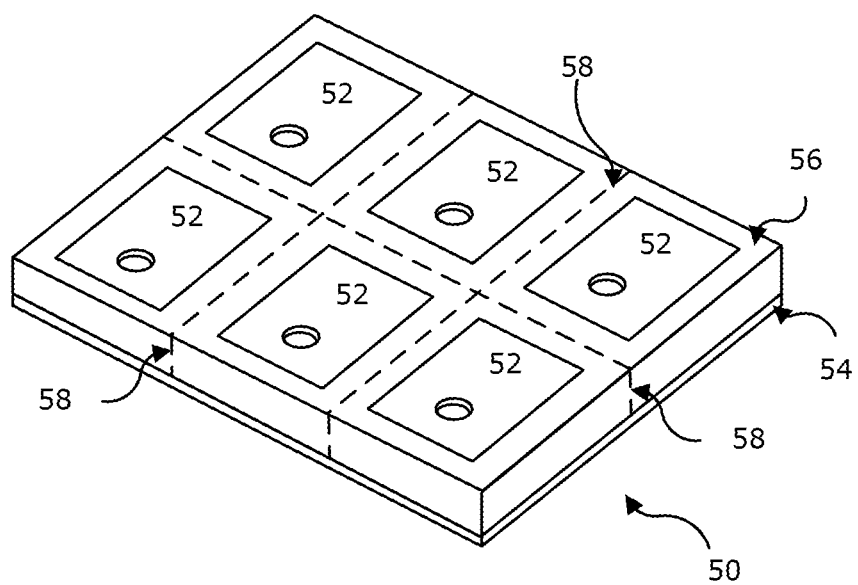
FIG. 5 is a perspective view of the array of FIG. 4 with an epoxy layer deposited thereupon.

Referring to FIGS. 3-5, a process is illustrated for manufacturing the package 2 described above. FIG. 3 illustrates a method 100 for creating an individual package from an array of covers which have been deposited on a layer of FR-4 material.

Figure 7:
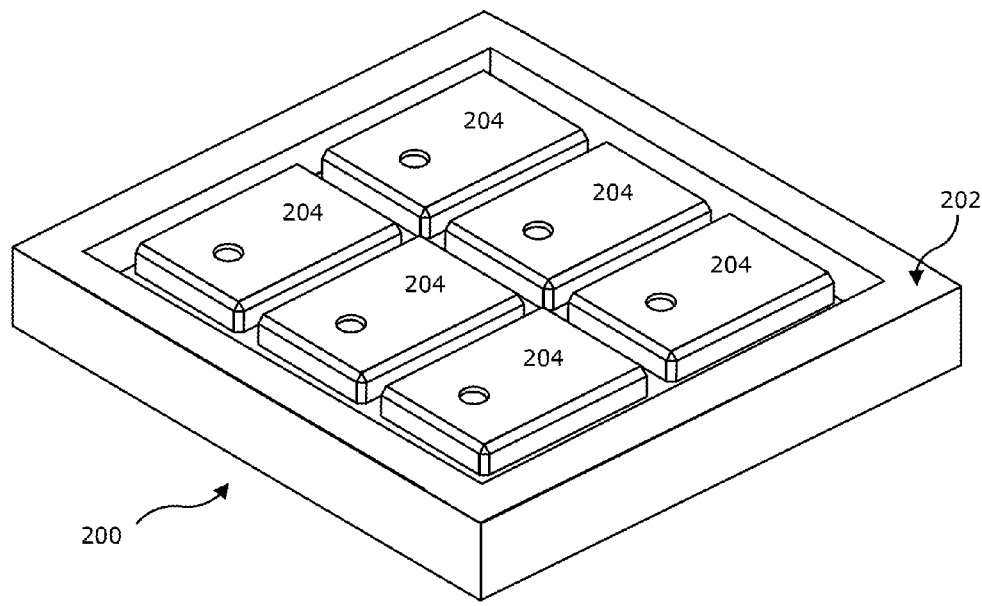
FIG. 7 is a perspective view of an array of packages surrounded by a dam.
Figure 8:
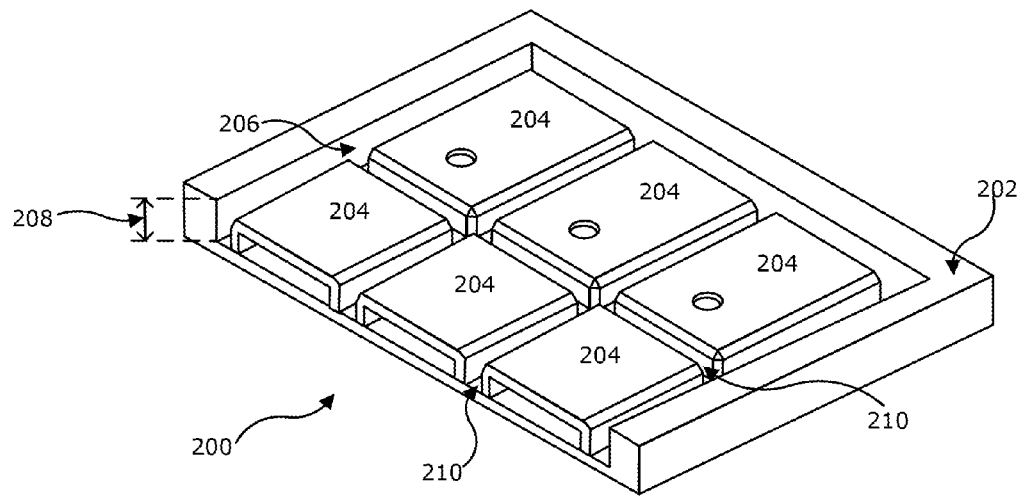
FIG. 8 is a cross-sectional view of the array of FIG. 7.

In a first step 102, adhesive and/or solder is applied to the PCB layer. In a second step 104, one or more metal covers are positioned onto the PCB layer. These covers may be added by, for example, individual pick-and-place, gang pick-and-place, palletizing and flipping. In a third step 106, the metal cans or covers are mechanically and electrically coupled to the PCB layer, via for example, a curing or reflow process (which can occur before or after step 108, depending on the embodiment). The array of metal covers (described below) creates channels or "streets" between the rows of covers. In a fourth step 108, epoxy is deposited onto the PCB layer to fill in these channels, streets, or cavities. In an embodiment, illustrated in FIGS. 7 and 8, a dam 202 may be provided which surrounds an array 200 of packages 204, and adhesive may be poured or otherwise dispensed to surround the packages 204 but be bounded by the dam 202. The dam 202 may have a shape which is rectangular; however, other shapes are contemplated as necessary for a given application. Walls 206 of the dam 202 may have a height 208 sufficient to allow the epoxy (not shown) to level or be leveled at a height necessary to surround the package 204 and provide a sufficient seal against the packages 204. The walls 206 may serve to terminate channels 210. The dam 202 may be constructed from metal, plastic, rubber, or other material appropriate for a given application. In a fifth step 110, the epoxy is cured. In a sixth step 112, the individual packages are de-paneled using singulation techniques, such as, for example, the use of a wafer saw, or other method contemplated by those of skill in the art.

Figure 6:
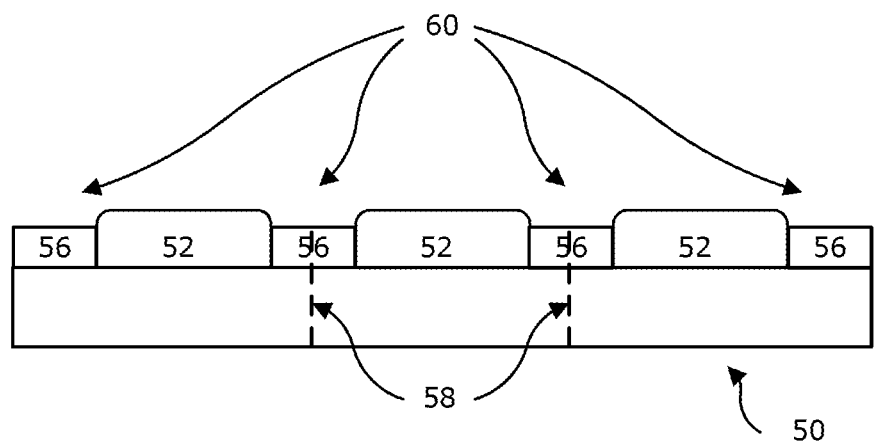
FIG. 6 is an isolated side cross-sectional view of an array of microphone packages having a layer of epoxy deposited thereupon.

An example of an array 50 is provided in FIG. 4 in a perspective view. The array 50 has several covers 52 which are attached to a layer 54 of printed circuit board. FIG. 5 illustrates the layer 54 having an epoxy layer 56 deposited thereupon to fill the channels 6o and/or form the epoxy wall. An isolated side view, in FIG. 6, shows that enough epoxy 56 is deposited within channels 60 between each of the rows of covers 52 that a wall, or boundary, is formed around the perimeter of the cover 52. Once singulation has been performed on the array 50, along, for example, dotted lines 58, in addition to substantially perpendicular lines (not shown, but contemplated by those of skill in the art), the individual packages (an example of which is provided in FIG. 2) can be attached to a layer of printed circuit board as part of a package for housing a transducer.

Second Embodiment

In a second embodiment of the present invention, a plurality of packages for MEMS transducers is manufactured, where the top surfaces of the individual package covers include solder pads for making second-level interconnections, and the transducers are attached to a panel of undivided package substrates. The covers are attached to the panel of substrates by mechanically and electrically connecting solder pads on the bottom of the edges of the covers to corresponding solder pads on the top surfaces of the substrates. The channels between the covers are filled with an epoxy, which acoustically seals the interior cavities under the covers.

Figure 9:
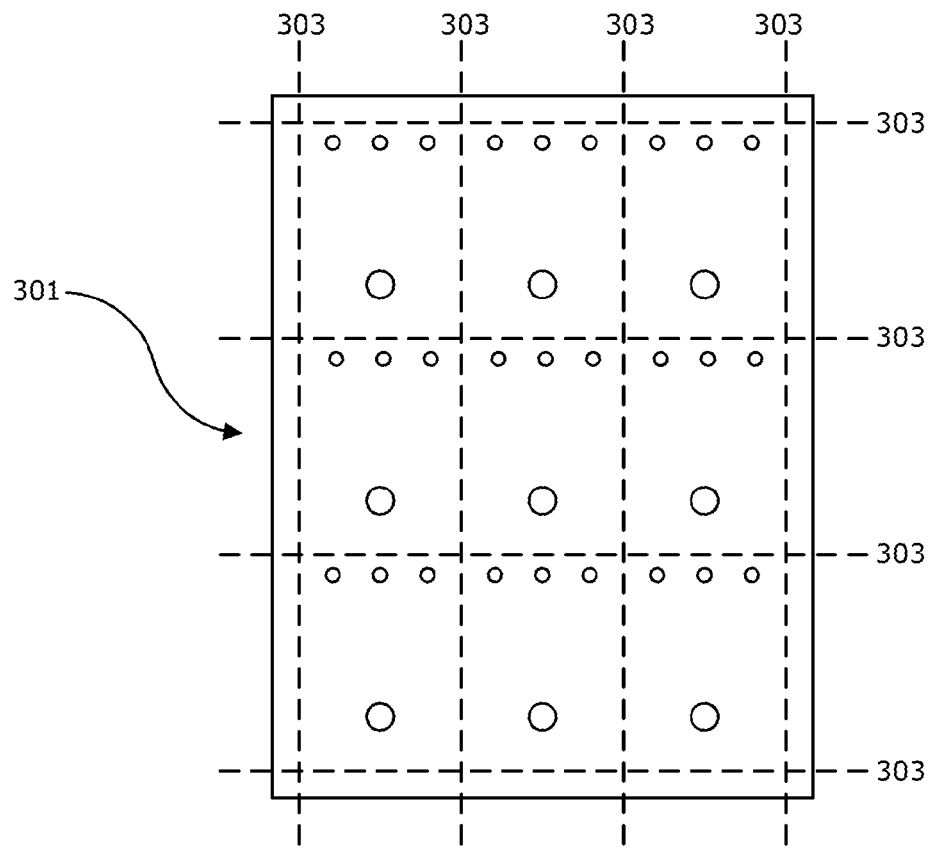
FIG. 9 is top view of a panel of package substrates prior to assembly.
Figure 10:
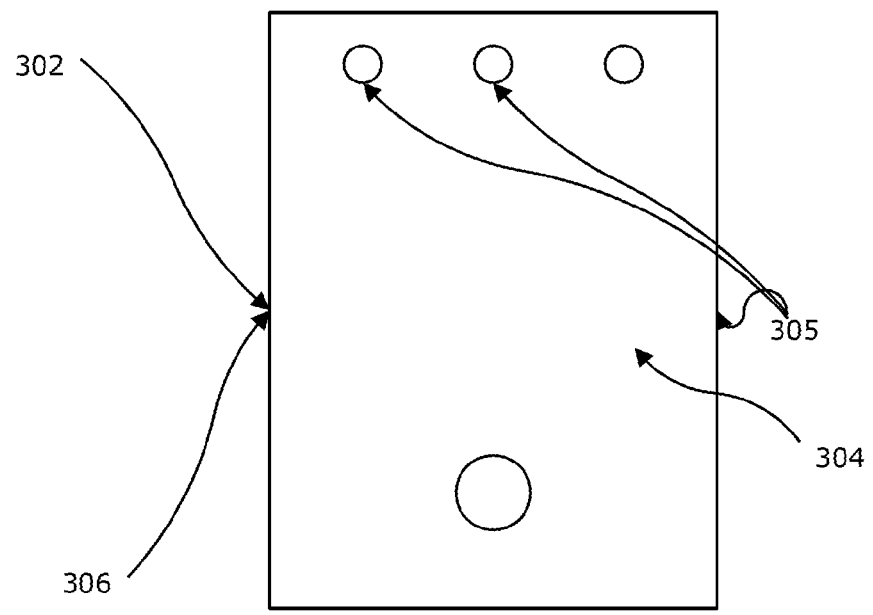
FIG. 10 is a top view of a single package substrate prior to assembly.

As shown in FIGS. 9 and 10, manufacturing of the plurality of packages 300 begins with a base layer panel 301 of interconnected individual package substrates 302; the dotted lines 303 indicate the boundaries of each package substrate 302. (For the purpose of describing this embodiment, there are nine substrates 302 arranged in a 3×3 array; however, the number and array dimensions are limited only by manufacturing constraints.) Each package substrate 302 includes a top surface 304 having a plurality of solder pads 305, and in this embodiment, an aperture 306, which functions as an acoustic port that allows sound waves to enter package 300. Package substrate 302 comprises printed circuit board material, and may have additional solder pads and electrical pathways (not shown) for electrically connecting electrical components to solder pads 305 and/or to each other.

Figure 11:
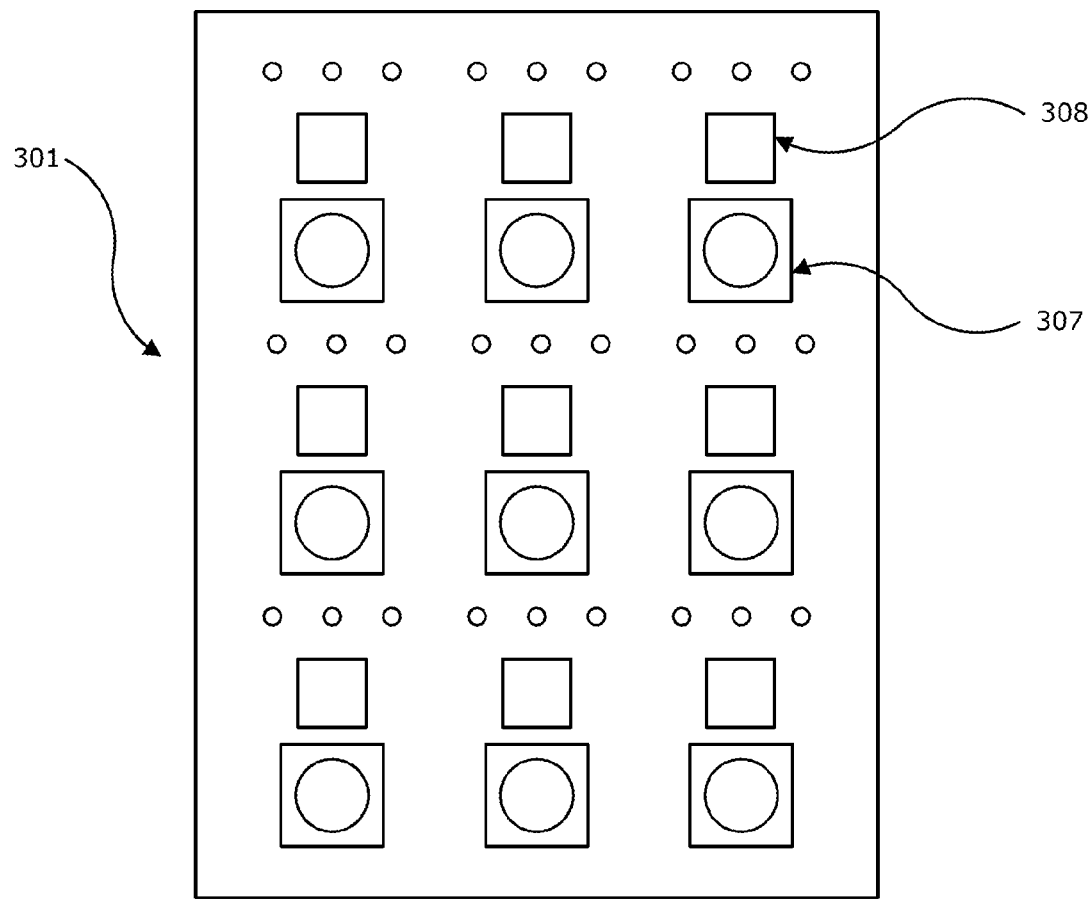
FIG. 11 is a top view of a panel of package substrates after attachment of MEMS and ASIC dies.
Figure 12:
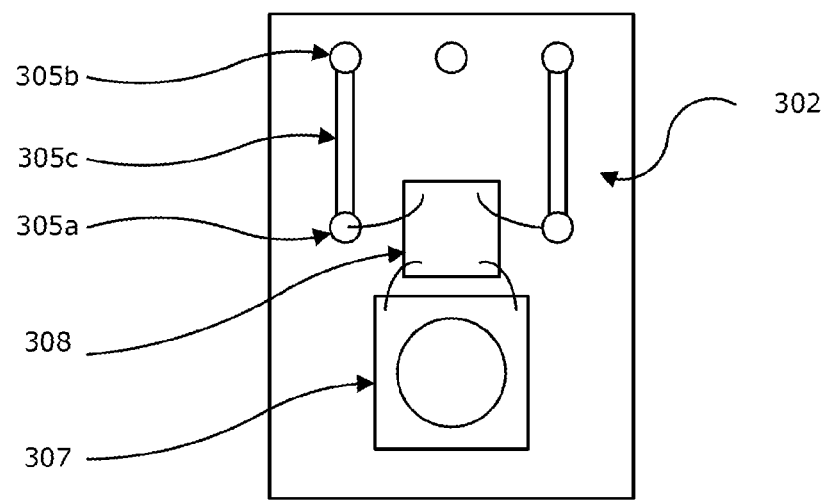
FIG. 12 is a top view of a single package substrate after attachment of MEMS and ASIC dies.

As shown in FIG. 11, a plurality of MEMS microphone dies 307 have been mechanically attached to top surface 304 of each of package substrates 302. In this embodiment, a plurality of ASIC dies 308 has also been mechanically attached to the top surface 304 of each of package substrates 302. MEMS microphone dies 307 (and ASIC dies 308, where present) are electrically connected to solder pads 305 by wire bonding, flip chip mounting, or other first-level interconnection mechanisms known to one of ordinary skill. By way of example and not limitation, as shown in FIG. 12, a MEMS microphone die 307 and an ASIC die 308 are attached to the top surface 304 of package substrate 302 using adhesive, dies 307 and 308 are electrically connected to each other using wire bonding, die 308 are electrically connected to a solder pad 305a using wire bonding, and solder pads 305a and 305b are connected to each other using an electrical circuit printed 305c on top surface 304 of package substrate 302.

Each cover 309 is a composite of conductive and non-conductive material. By way of example and not limitation, the non-conductive material can be liquid crystal polymer (LCP) plastic with metal traces written on the outer sides of the molded LCP cover using laser direct writing and plated using methods known to one of ordinary skill. In other embodiments, the cover could be made of printed circuit board material or a ceramic, with the pads, vias, internal pathways, and/or traces formed using methods known to one of ordinary skill.

Figure 13:
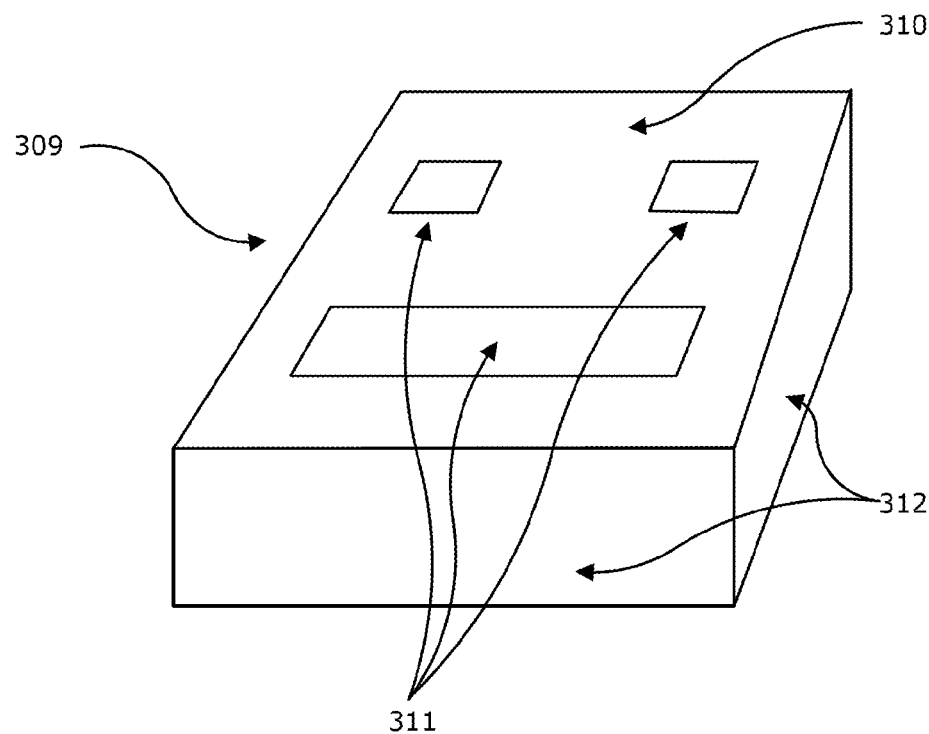
FIG. 13 is an angled top view of a package cover.
Figure 14:
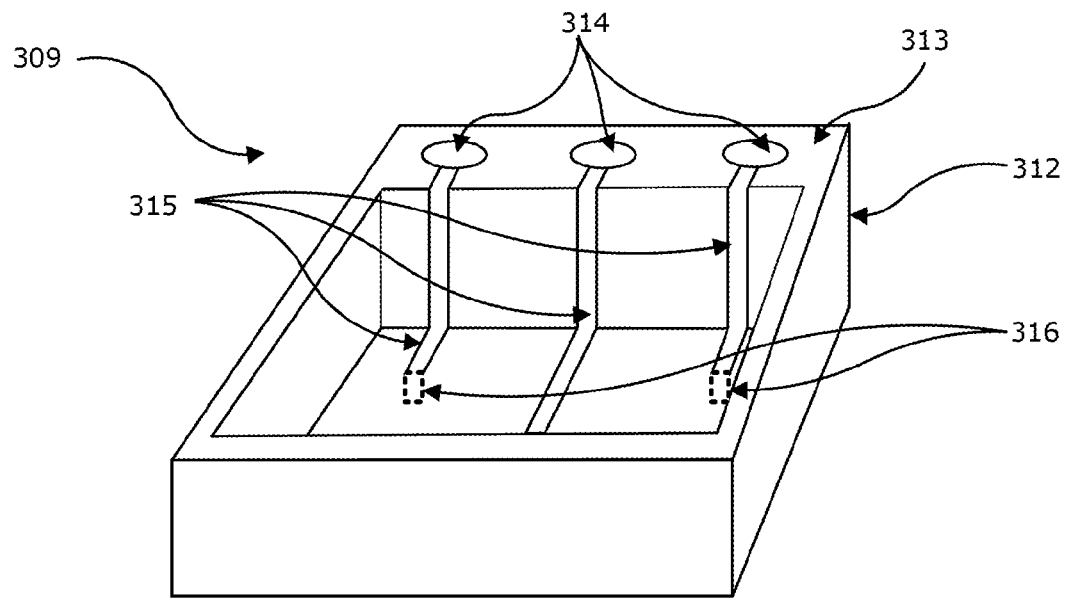
FIG. 14 is an angled bottom view of a package cover.

As shown in FIG. 13, cover 309 has a top surface 310 and side portions 312 that are substantially perpendicular to top surface 310. Top surface 310 has a plurality of solder pads 311 which function as the second-level package interconnects. In this embodiment, solder pads 311 are suitable for attaching package 300 to an external printed circuit board using a solder reflow process; in other embodiments, solder pads 311 could be replaced with other second-level interconnection mechanisms known to one of ordinary skill. As shown in FIG. 14, on the bottom surface 313 of at least one side portion 312, there are a plurality of solder pads 314; as shown in FIG. 12, at least some of the solder pads 311 are electrically connected to solder pads 314 via metal traces 315 formed on bottom surface 313, the inner surface of side portion 312, and the underside of top surface 310. Vias 316 (shown in outline) run perpendicularly between solder pads 311 on top surface 310 to metal traces 315. In other embodiments (not shown), solder pads 311 are electrically connected to solder pads 311 using metal traces 315 formed along top surface 310, down the outer surface of side portion 312, and along bottom surface 313. In other embodiments (not shown), solder pads 311 are electrically connected to solder pads 311 using vias and conductive pathways within interior layers of cover 309. In some embodiments, some solder pads 314 are not electrically connected to solder pads 311; these solder pads 314 are present only for providing a uniform mechanical connection when cover 309 is attached to package substrate 302.

Figure 15:
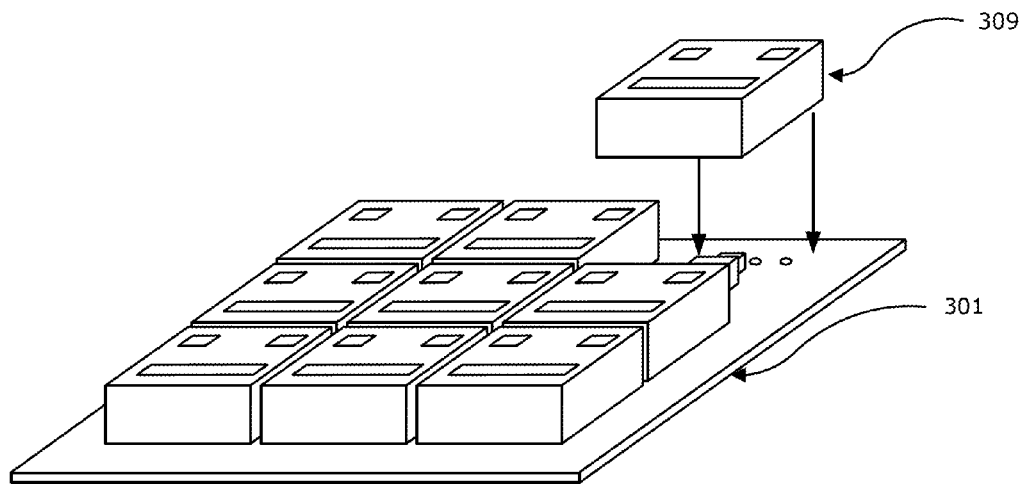
FIG. 15 is an angled view of a panel of package substrates during attachment of the covers.
Figure 16:
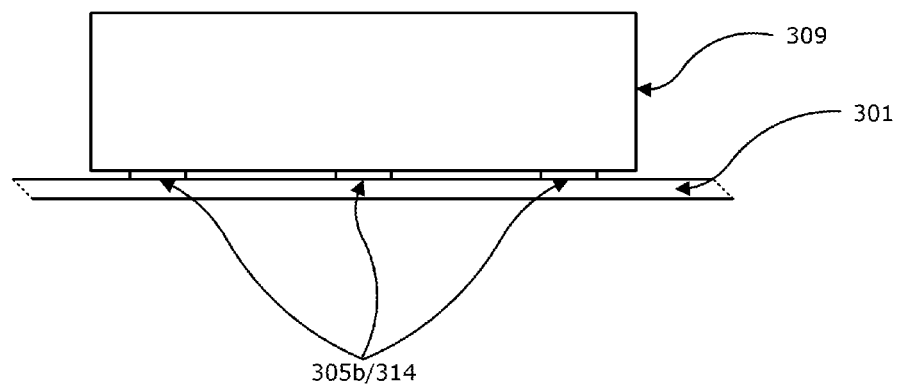
FIG. 16 is a side view of a cover attached to a panel of package substrates.

As shown in FIG. 15, after wire bonding (if necessary), and after application of solder paste onto solder pads 305b, each of the plurality of covers 309 are positioned onto a package substrate 302, such that solder pads 314 on the bottom surfaces of side portions 312 are aligned with solder pads 305b on the top surfaces of package substrate 302. Panel 301 is then placed into a reflow oven to mechanically and electrically join solder pads 314 and 305b. In other embodiments, solder pads 314 and 305b can be mechanically and electrically joined using adhesive rather than solder; depending on the adhesive, joining solder pads 314 and 305b may require application of heat or other fixing processes. After joining solder pads 314 and 305b, there will be a slight gap between the covers and substrates, as shown in FIG. 16.

Figure 17:
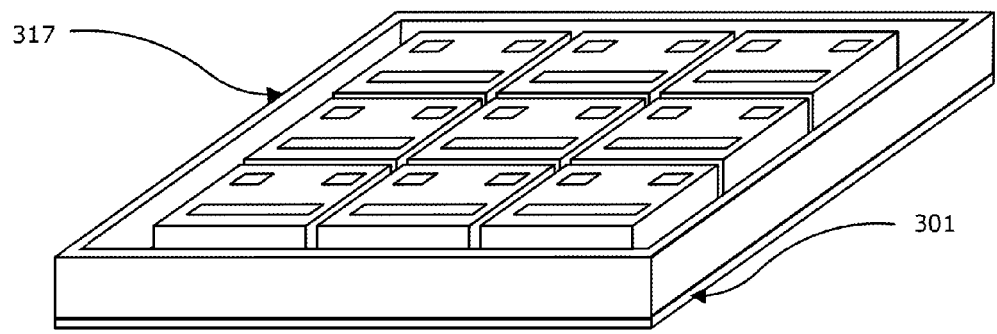
FIG. 17 is an angled view of a dam attached to the panel of package substrates and surrounding the package covers.
Figure 18:
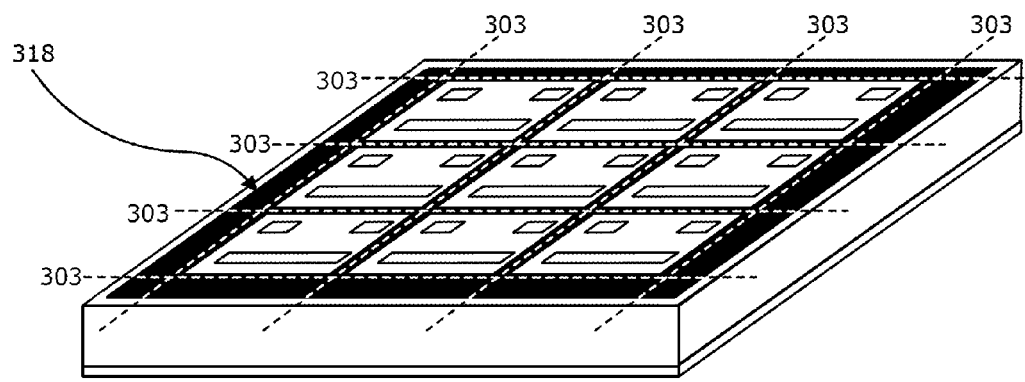
FIG. 18 is an angled view of the panel of package substrates, dam, and package covers, after depositing epoxy into the channels.
Figure 19:
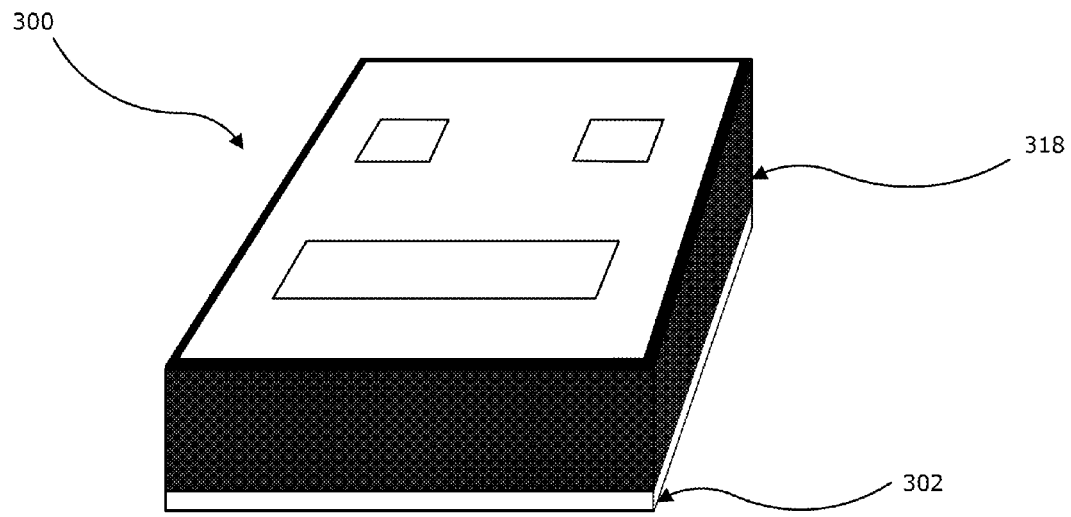
FIG. 19 is an angled view of the solder pad side of a MEMS microphone package.
Figure 20:
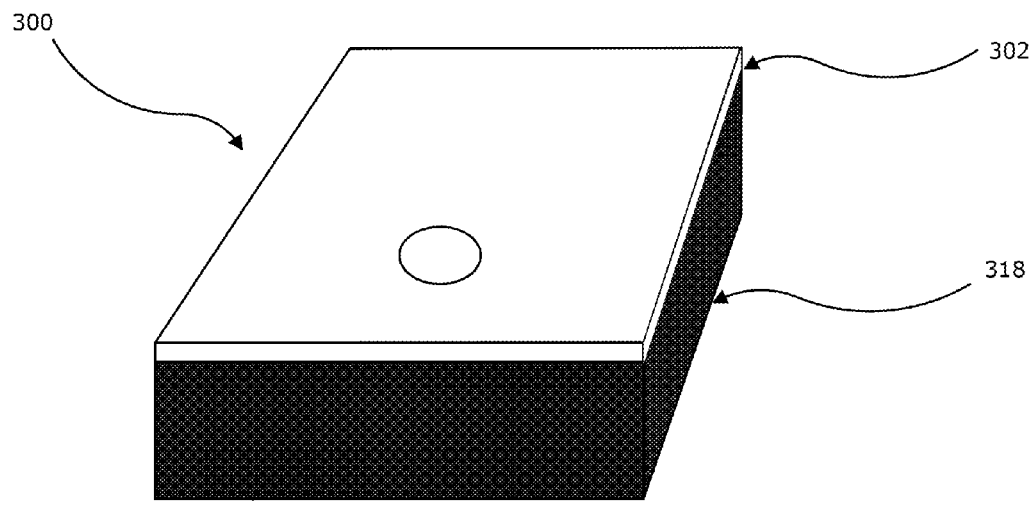
FIG. 20 is an angled view of the aperture side of a MEMS microphone package.
Figure 21:
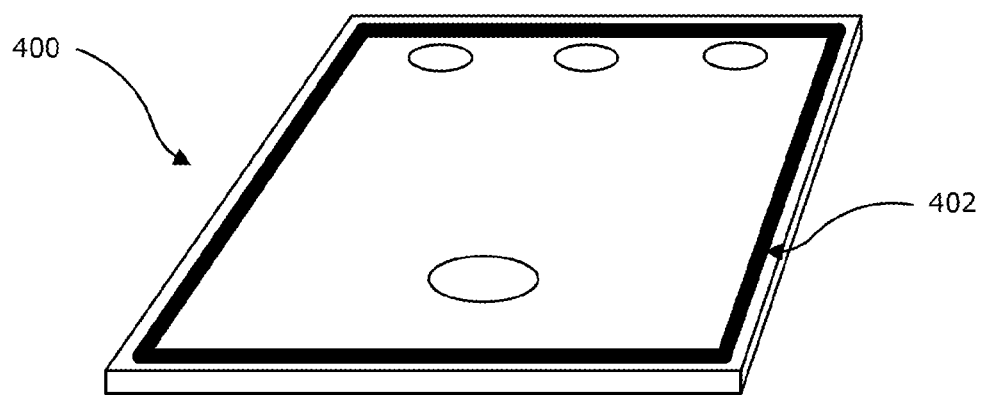
FIG. 21 is a prior art package substrate.
Figure 22:
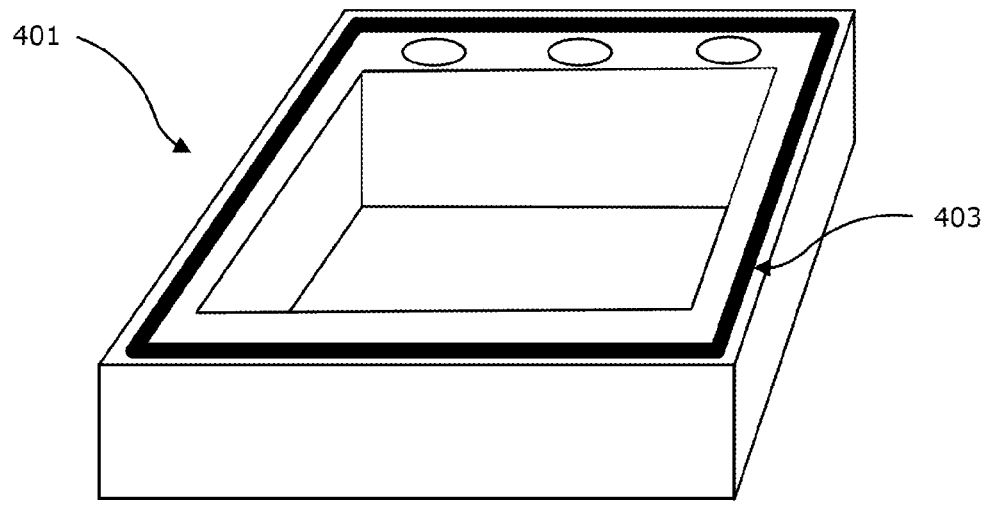
FIG. 22 is a prior art package cover.

Next, as shown in FIG. 17, a dam 317 is placed on top of (or around the edges of) panel 301, surrounding the plurality of covers on top of panel 301. Dam 317 can be made of metal, plastic, rubber, or any other material suitable for blocking the flow of epoxy beyond the outer edges of panel 301. As shown in FIG. 18, epoxy 318 is then deposited onto panel 301 into the channels formed between (but not over) covers 309. Epoxy 318 is sufficiently viscous that it will fill the channels and acoustically seal the gaps between covers 309 and package substrates 302, but will not enter into the interior cavity under the covers. (Note that an insignificant amount of epoxy may enter the gap without entering the interior cavity.) In embodiments that include metal traces 315 on the outer sides of side portions 312, epoxy 318 will substantially cover the traces, protecting them from physical damage and unwanted electrical contact. By way of example and not limitation, a suitable epoxy is EPO-TEK H70E series. After epoxy 318 has hardened, panel 301 is diced through the epoxy-filled channels along boundaries 303 as indicated in FIG. 18. The result is a plurality of MEMS microphone packages 300 as shown in FIGS. 19 and 20.

Other Embodiments and Variations

A number of variations in the foregoing embodiments readily come to mind. By way of example and not limitation:

- Depositing the epoxy into the channels between the covers could be performed using dispensing, jetting, pouring, printing, overfilling and scraping excess, spraying, and transfer stamping.
- The epoxy deposited into the channels between the covers could be in the form of a self-leveling fluid, a powder, a paste, or a gel.
- After it is deposited into the channels between the covers, the epoxy could be set using heat, exposure to light, use of a catalyst, or use of moisture.
- The singulation of the panel into individual packages could be performed by dicing, punching, routing, sawing, or scribing and breaking.
- The placement of MEMS dies, ASIC dies, and covers could be positioned using individual pick-and-place, gang pick-and-place, or palletizing and flipping.
- In the second embodiment, portions of the cover could include additional conductive material, located on the inside surface of the cover, the outside surface of the cover, or within the cover, and connected to ground to provide EMI shielding.
- The base layer/substrate to which the transducer is attached could have additional conductive material connected to ground to provide EMI shielding.
- The various methods and materials disclosed in the foregoing embodiments could be selectively combined for specific applications.

While specific embodiments have been illustrated and described, the scope of protection is only limited by the scope of the accompanying claims.

We claim:

1. A method for manufacturing a plurality of MEMS transducer packages comprising:
    attaching a plurality of MEMS transducers to a plurality of substrates, where:
        the substrates are interconnected in a single undivided flat panel,
        each of the substrates has a top surface, and
        the transducers are attached to the top surfaces of the substrates, one transducer per substrate;
    positioning a plurality of cup-shaped covers onto the plurality of substrates, where:
        the covers are positioned onto the top surfaces of the substrates, one cover per substrate,
        each cover comprises a plurality of side portions and a top portion, the side portions being substantially perpendicular to the top portion,
        each transducer is located within an open interior cavity formed between the top surface of one of the substrates and the cover that is positioned over that substrate,
        for each cover positioned onto one of the substrates, a first plurality of solder pads on a bottom surface of at least one side portion of the cover are joined with a second plurality of solder pads on the top surface of the substrate, leaving a gap between the bottom surface of the side portion of the cover and the top surface of the substrate, and
        open channels are formed on the top surfaces of the substrates between the adjacent side portions of adjacent covers;
    attaching a dam to the periphery of the panel, the dam surrounding the plurality of covers and forming additional open channels between the dam and those covers that are adjacent to the dam; and
    depositing an epoxy into the channels, substantially filling the channels but not covering the top portions of the covers, where the epoxy is sufficiently viscous to seal the gaps between the bottom surfaces of the covers and the top surfaces of the substrates, but not so viscous as to flow significantly into the interior cavity; and
    after the epoxy has hardened, singulating the panel into individual MEMS transducer packages by cutting vertically through the epoxy in the channels and through the panel under the channels.

2. The method of claim 1 where:
    each of the substrates further comprises a bottom surface and an aperture between the top and bottom surfaces of the substrate; and
    attaching each of the transducers comprises first positioning the transducer directly over the aperture.

3. The method of claim 2 where:
    each of the transducers is an acoustic transducer; and
    depositing the epoxy comprises acoustically sealing the gaps between the bottom surfaces of the covers and the top surfaces of the substrates.

4. The method of claim 1 where:
    attaching the dam comprises positioning the dam on a top surface of the periphery of the panel.

5. The method of claim 1 where:
    attaching the dam comprises positioning the dam on an outside surface of the periphery of the panel.

6. The method of claim 1 where:
    joining the first plurality of solder pads and the second plurality of solder pads comprises using a solder reflow process.

7. The method of claim 1 where:
    joining the first plurality of solder pads and the second plurality of solder pads comprises using a conductive adhesive.

8. The method of claim 1 where:
the first plurality of solder pads are distributed over the bottom surfaces of multiple sides portions of each cover such that when the first plurality of solder pads is joined to the corresponding second plurality of solder pads, there is a uniform gap between the bottom surfaces of the multiple side portions of the cover and the top surface of the substrate.

9. The method of claim 1 where for each cover and substrate onto which the cover is positioned:
the cover further comprises an inner surface with respect to the cup shape and an outer surface with respect to the cup shape;
the outer surface of the top portion of the cover comprises a third plurality of solder pads;
an electrical pathway connects one of the third plurality of solder pads and one of the first plurality of solder pads; and
joining the first plurality of solder pads and the second plurality of solder pads electrically connects one of the third plurality of solder pads and one of the second plurality of solder pads.

10. The method of claim 9 where:
the electrical pathway comprises a via between the outer surface of the top portion of the cover and the inner surface of the top portion of cover and a metal trace on the inner surface of the cover.

11. The method of claim 9 where:
the electrical pathway comprises a via between the outer surface of the top portion of the cover and a conductive inner layer within the top portion of the cover.

12. The method of claim 9 where:
the electrical pathway comprises a metal trace on the outer surface of the top portion of the cover and a side portion of the outer surface of the cover.

13. The method of claim 12 where:
depositing the epoxy into the channels further comprises partially covering the metal trace on the side portions of the outer surface of the cover to protect the metal trace from physical damage and unwanted electrical contact.

14. The method of claim 9 where:
the cover further comprises a first layer of conductive material that is electrically connected to one pad of the first plurality of solder pads and to one pad of the third plurality of solder pads;
the substrate further comprises a second layer of conductive material that is electrically connected to one pad of the second plurality of solder pads; and
joining the first plurality of solder pads and the second plurality of solder pads electrically connects the first layer of conductive material and the second layer of conductive material to form a shield that protects the transducer from electromagnetic interference.

15. The method of claim 14 where:
the first layer of conductive material is located on the inner surface of the cover.

16. The method of claim 14 where:
the first layer of conductive material is located in a layer within the cover.

\* \* \* \* \*